(12) United States Patent
Liikanen et al.

(10) Patent No.: US 11,335,425 B2
(45) Date of Patent: *May 17, 2022

(54) MEMORY SYSTEM QUALITY INTEGRAL ANALYSIS AND CONFIGURATION

(71) Applicant: Micron Technology, Inc., Boise, ID (US)

(72) Inventors: Bruce A. Liikanen, Berthoud, CO (US); Gerald L. Cadloni, Longmont, CO (US); David Miller, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/020,324

(22) Filed: Sep. 14, 2020

(65) Prior Publication Data
US 2020/0411126 A1   Dec. 31, 2020

Related U.S. Application Data

(63) Continuation of application No. 15/981,829, filed on May 16, 2018, now Pat. No. 10,825,540.

(51) Int. Cl.
*G11C 29/00* (2006.01)
*G11C 29/10* (2006.01)
(Continued)

(52) U.S. Cl.
CPC .......... *G11C 29/10* (2013.01); *G06F 13/1668* (2013.01); *G06F 17/18* (2013.01); *G11C 16/26* (2013.01); *G11C 29/42* (2013.01); *G11C 29/44* (2013.01); *G11C 29/56008* (2013.01); *G11C 2029/4402* (2013.01)

(58) Field of Classification Search
CPC ......... G11C 29/10; G11C 29/42; G11C 29/44; G11C 29/56008; G11C 29/52; G11C 16/26; G11C 16/32; G11C 16/30; G11C 16/3495; G06F 13/1668; G06F 17/18
See application file for complete search history.

(56) References Cited

U.S. PATENT DOCUMENTS 10,282,107 B1   5/2019  Martin et al.
10,535,417 B2   1/2020  Liikanen et al.
(Continued)

*Primary Examiner* — Hiep T Nguyen
(74) *Attorney, Agent, or Firm* — Perkins Coie LLP

(57) ABSTRACT

A memory quality engine can improve the operation of a memory system by setting more effective operating parameters, disabling or removing memory devices unable to meet performance requirements, and providing evaluations between memory populations. These improvements can be accomplished by converting quality measurements of a memory population into CDF-based data, formulating comparisons of the CDF-based data to metrics for quality analysis, and applying the quality analysis. In some implementations, the metrics for quality analysis can use one or more thresholds, such as a system health threshold. Formulating the comparison to these metrics can include determining an area between a baseline frequency and a curve specified by the CDF-based data. In some implementations, this area can further be defined by a lowest frequency bound and/or can be compared as a ratio to an area of a rectangle that contains the CDF curve.

20 Claims, 11 Drawing Sheets

(51) Int. Cl.
*G06F 13/16* (2006.01)
*G06F 17/18* (2006.01)
*G11C 29/42* (2006.01)
*G11C 29/44* (2006.01)
*G11C 29/56* (2006.01)
*G11C 16/26* (2006.01)

(56) References Cited

U.S. PATENT DOCUMENTS

| | | |
|---|---|---|
| 10,825,540 B2 * | 11/2020 | Liikanen ............. G06F 13/1668 |
| 2004/0128591 A1 * | 7/2004 | Ihs .................... G01R 31/31709 |
| | | 714/704 |
| 2009/0016140 A1 | 1/2009 | Qureshi et al. |
| 2010/0332923 A1 | 12/2010 | D'Abreu et al. |
| 2014/0029336 A1 | 1/2014 | Venkitachalam et al. |
| 2016/0041870 A1 | 2/2016 | Davis et al. |
| 2016/0110124 A1 | 4/2016 | Camp et al. |
| 2016/0225436 A1 | 8/2016 | Wang et al. |
| 2017/0003880 A1 | 1/2017 | Fisher et al. |
| 2018/0159559 A1 | 6/2018 | Bazarsky et al. |
| 2018/0159560 A1 | 6/2018 | Sharon et al. |
| 2019/0056994 A1 | 2/2019 | Shulkin et al. |
| 2019/0155672 A1 | 5/2019 | Wang et al. |
| 2019/0171381 A1 | 6/2019 | Ioannou et al. |
| 2019/0348102 A1 | 11/2019 | Smith et al. |
| 2019/0354299 A1 | 11/2019 | Liikanen et al. |
| 2019/0355434 A1 | 11/2019 | Liikanen et al. |
| 2019/0355435 A1 | 11/2019 | Liikanen et al. |

\* cited by examiner

US 11,335,425 B2

MEMORY SYSTEM QUALITY INTEGRAL ANALYSIS AND CONFIGURATION

CROSS-REFERENCE TO RELATED APPLICATIONS

This application is a continuation of U.S. application Ser. No. 15/981,829, filed May 16, 2018; which is incorporated herein by reference in its entirety.

The applications titled "Memory System Quality Margin Analysis and Configuration", identified as U.S. application Ser. No. 15/981,835, filed May 16, 2018; and titled "Memory System Quality Threshold Intersection Analysis and Configuration", identified as U.S. application Ser. No. 15/981,841, filed May 16, 2018, are each herein incorporated by reference in their entirety.

TECHNICAL FIELD

Embodiments of the disclosure relate generally to improving memory system functionality through advances in memory component integral analysis and resulting configurations of the memory system.

BACKGROUND

A memory system can be a storage system, such as a solid-state drive (SSD), and can include one or more memory components that store data. For example, a memory system can include memory devices such as non-volatile memory devices, volatile memory devices, or a combination of both. In general, a host system can utilize a memory system to store data at the memory devices of the memory system and to retrieve data stored at the memory system.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

The techniques introduced here may be better understood by referring to the following Detailed Description in conjunction with the accompanying drawings, in which like reference numerals indicate identical or functionally similar elements.

DETAILED DESCRIPTION

Figure 1:
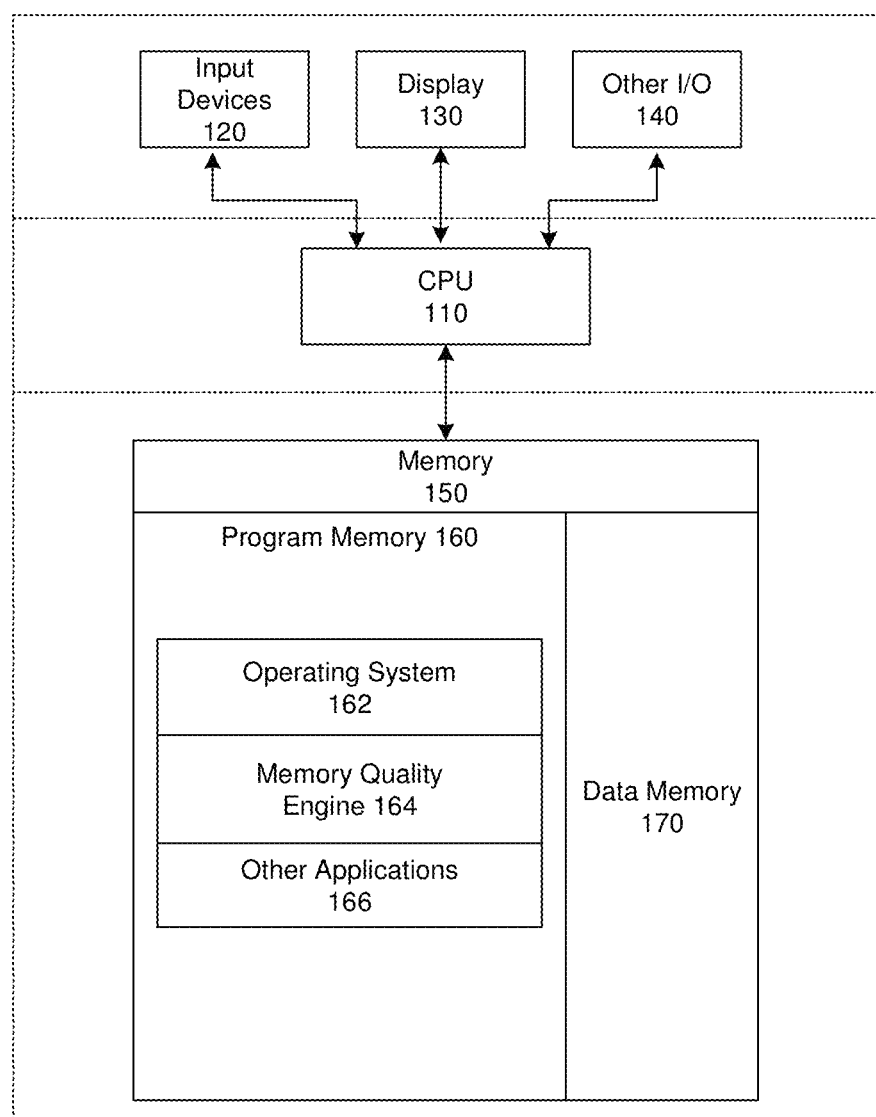
FIG. 1 illustrates an example computing environment that includes a memory system in accordance with some implementations of the present disclosure.

Existing memory analysis systems fail to provide metrics useful to adequately optimize memory systems performance, diagnose memory system quality or remaining life and do not effectively provide results in a manner that facilitates analytical connections between data sets.

Aspects of the present disclosure a memory quality engine that address the above and other deficiencies by implementing analyses of quality measurements in terms of cumulative distribution function (CDF) based data. The memory quality engine can perform analysis on memory units at different granularities, where a quality measurement corresponds to each unit of memory under analysis of the granularity size. For example, the granularity of the analysis can be one of: a block level, page level, codeword level, region level, whole device level, or a level corresponding to multiple devices within a memory system, etc. The memory under analysis for which quality measurements are taken is referred to herein as the "memory population." For example, a memory population can be any memory system such as a subset of the memory within a single memory device, all the memory of a memory device, or memory from multiple memory devices. A memory system can be a storage system, such as a solid-state drive (SSD). In some embodiments, a memory system is a hybrid memory/storage system. In various implementations, memory devices can include non-volatile memory devices, such as, for example, negative-and (NAND).

In some implementations, the memory quality engine can obtain the quality measurements in terms of frequency of memory units for given error counts. In some implementations, the quality measurements can be histograms of this data, where the independent variable is a number of errors or other quality measure and the dependent variable is the number of memory units that have that number of errors. The memory quality engine can convert the quality measurements into CDF-based data, e.g. as one minus the CDF of the histogram quality measure, on a logarithmic scale.

While the descriptions herein use 1-CDF as the CDF-based data, other CDF-based data, such as an unmodified version of the CDF, can be used. In such cases descriptions of terms relative to the CDF may be reversed. For example, the "lower frequency bound" described below for a 1-CDF type CDF-based data, would instead be a "higher frequency bound" for an unmodified CDF. As another example, the baseline frequency of 0 or 1, instead of being the highest frequency as described below, might be the lowest frequency of the CDF-based data. While the embodiments described herein are described in terms of quality analysis for memory populations, similar analysis and improvement can also be performed for other technologies for which quality data measures can be obtained.

Once the memory quality engine has CDF-based data, it can perform a quality analysis by formulating comparisons of the CDF-based data to metrics. In some implementations, a metric can be a threshold such as a system trigger threshold or an uncorrectable error correction condition threshold, which are set based on the error correction capabilities of a memory system. In some implementations, a metric can be a threshold area size that an area under a curve formed by the CDF-based data is compared to. The memory quality engine can determine the size of an area "under" the curve as the area formed between a frequency baseline and the CDF curve. In some implementations, this area can be further based on a lower frequency bound. In some implementations, the portion of the area below the threshold is counted as positive and any portion above the threshold is subtracted from the positive area. The size of this area can be used as a quality analysis measure for the memory population.

In some implementations, this quality analysis measure can be taken in terms of a ratio of the area size to an area defined by the four lines of: 1) the vertical line at the CDF-based data point with the highest error count, 2) the frequency baseline, 3) zero on the quality metric x-axis, and 4) either a) the frequency lower bound or b) the horizontal line at the CDF-based data point with the lowest frequency.

Using results of the quality analysis, the memory quality engine can make improvements to a memory system that includes the memory population. In some implementations, the improvements can include comparing the quality analysis results to a threshold to classify the memory population as being acceptable or being unacceptable. Where the memory population is unacceptable, it can be added to a data structure identifying questionable memory, it can be disabled, or it can be flagged for removal from the memory system. In some implementations, multiple thresholds can be used to classify the memory population into one of multiple corresponding categories, which can have associated actions. For example, a set of categories can be: high performing drive—available for critical use; acceptable drive—available for standard use; low performing drive—available for low-priority use, schedule further quality checks; or drive failure—schedule data transfer and deactivation.

Application of the methods and systems described herein provides a number of technical improvements, e.g. for memory devices, processing units, or other devices for which quality measurements can be taken. A memory drive, for example, can be configured to operate faster than would otherwise be possible by virtue of having a measure of how close the drive is to a failure condition. More specifically, an effective analysis of quality measurements can include determining a safety margin that a particular drive has before reaching a failure condition and, where that safety margin is sufficiently large, adjusting operating parameters of the drive to increase drive performance (e.g., speed, latency, energy efficiency, etc.). This performance increase can then be achieved without undue concern for the drive passing into a failure condition. A similar procedure could be performed on technologies besides memory, such as to accelerate a CPU, adjust power consumption levels (e.g. using voltage levels and fan speeds), etc.

As another example, a memory system can be made more reliable through meaningful determinations of the health of a memory population, at various granularities. In some instances, this can be accomplished based on determined safety margins: if a drive's safety margin is too small, operating parameters of the drive can be decreased to improve drive reliability. In some implementations, population health measures can be used to identify and disable drives with insufficient health. More specifically, a health measure for a memory population, such as a trigger rate, UECC rate, or integral measure, can be compared to a corresponding health threshold. Where the health measure is below the threshold, the memory population can be disabled or removed from a memory system. In some implementations, health measures can be used to classify or sort a set of memory populations. For example, an integral measure for each of a set of memory populations can be used to match memory populations with storage functions, based on how critical the storage functions are. More healthy memory populations can be assigned more critical storage functions, while less healthy populations can still be used for less critical storage functions.

As yet another example of technical improvements offered by this technology, particular memory populations can be identified as defective, e.g. for removal or replacement. This can be accomplished by identifying an "extrinsic tail" for a memory population. An extrinsic tail can be identified using a projection of CDF-based data. As used herein a "projection" can be determined in various ways. In some implementations, the projection of the CDF-based data can be a best fit of the CDF-based data to a linear function. In some implementations, other modeling techniques can be used to determine the projection, such as using a function of a different degree, using the average of CDF-based data from other memory populations, or applying a machine learning algorithm to the CDF-based data or data of other memory populations to predict next data points from previous data points of the CDF-based data. In some implementations, the projection can be based on a portion of the CDF-based data. An extrinsic tail can be identified by comparing the projection to the actual CDF-based data and determining if a variance at higher error rate values deviates from the projection beyond a specified degree. Identifying an extrinsic tail can indicate the corresponding memory population is in some way defective, allowing corrective action to be taken. A pattern of defective devices can also be analyzed, e.g. to determine that particular parts, drive manufactures, etc. are more likely to produce defective memory populations.

This technology also provides new abilities to make analytical connections between data sets. For any given quality metric, the CDF-based data can be reliably compared across device types, device sources, operational parameters, etc. This allows for the dependent variables to be external factors. For example, two memory devices can have different components, sizes, manufactures, construction processes, etc. Comparisons of their CDF-based analytics can show how these external factors affect device performance.

Several implementations are discussed below in more detail in reference to the figures. FIG. 1 illustrates an example computing environment 100 in accordance with some implementations of the present disclosure. The computing environment 100 can comprise hardware components that provide memory analysis and configuration. Computing environment 100 can include one or more input devices 120 that provide input to the CPU(s) (processor) 110, notifying it of actions. The actions can be mediated by a hardware controller that interprets the signals received from the input device and communicates the information to the CPU 110 using a communication protocol. Input devices 120 can include, for example, a mouse, a keyboard, a touchscreen, an infrared sensor, a touchpad, a wearable input device, a camera- or image-based input device, a microphone, or other user input devices.

CPU 110 can be a single processing unit or multiple processing units in a device or distributed across multiple devices. CPU 110 can be coupled to other hardware devices, for example, with the use of a bus, such as a PCI bus or SCSI bus. The CPU 110 can communicate with a hardware controller for devices, such as for a display 130. Display 130 can be used to display text and graphics. In some implementations, display 130 provides graphical and textual visual feedback to a user. In some implementations, display 130 includes the input device as part of the display, such as when the input device is a touchscreen or is equipped with an eye direction monitoring system. In some implementations, the display is separate from the input device. Examples of display devices are: an LCD display screen, an LED display screen, a projected, holographic, or augmented reality display (such as a heads-up display device or a head-mounted device), and so on. Other I/O devices 140 can also be coupled to the processor, such as a network card, video card, audio card, USB, firewire or other external device, camera, printer, speakers, CD-ROM drive, DVD drive, disk drive, or Blu-Ray device.

In some implementations, the computing environment 100 also includes a communication device capable of communicating wirelessly or wire-based with a network node. The communication device can communicate with another device or a server through a network using, for example, TCP/IP protocols. Computing environment 100 can utilize the communication device to distribute operations across multiple network devices.

The CPU 110 can have access to a memory 150 in a device or distributed across multiple devices. A memory includes one or more of various hardware devices for volatile or non-volatile storage, and can include both read-only and writable memory. For example, a memory can comprise random access memory (RAM), various caches, CPU registers, read-only memory (ROM), and writable non-volatile memory, such as flash memory, hard drives, floppy disks, CDs, DVDs, magnetic storage devices, tape drives, device buffers, and so forth. A memory is not a propagating signal divorced from underlying hardware; a memory is thus non-transitory. Memory 150 can include program memory 160 that stores programs and software, such as an operating system 162, memory quality engine 164, and other application programs 166. Memory 150 can also include data memory 170 that can include quality measurements (e.g. histograms of quality data), CDF-based data obtained from quality measurements, memory usability thresholds, comparison metrics, action triggers, configuration data, settings, options or preferences, etc., which can be provided to the program memory 160 or any element of the computing environment 100.

Some implementations can be operational with numerous other computing system environments or configurations. Examples of computing systems, environments, and/or configurations that may be suitable for use with the technology include, but are not limited to, personal computers, server computers, handheld or laptop devices, cellular telephones, tablet devices, multiprocessor systems, microprocessor-based systems, programmable consumer electronics, network PCs, minicomputers, mainframe computers, distributed computing environments that include any of the above systems or devices, or the like.

Figure 2:
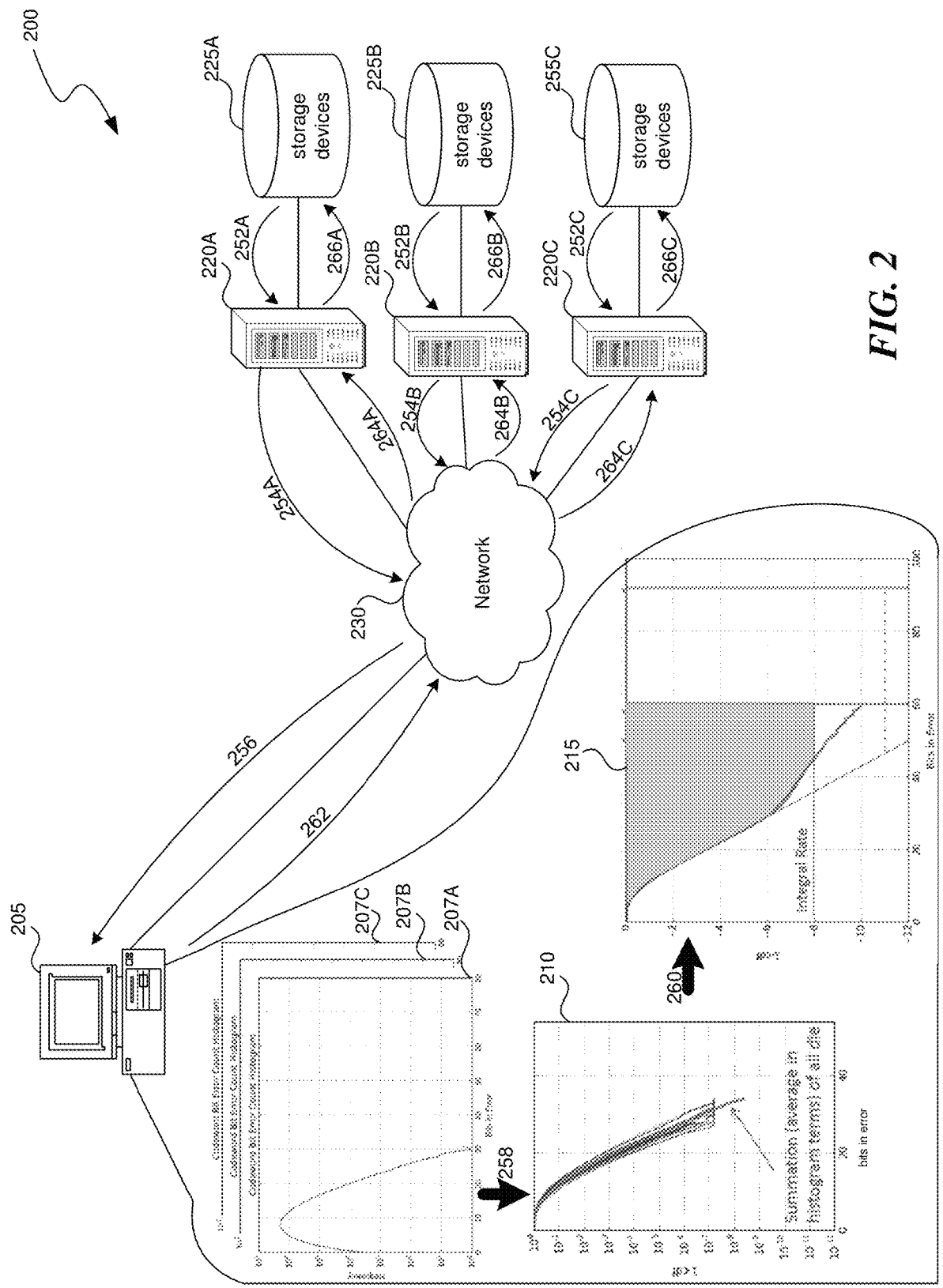
FIG. 2 is a conceptual diagram of an example of acting on memory quality data to improve memory performance.

FIG. 2 is a conceptual diagram of an example 200 of acting on memory quality data to improve memory performance. Example 200 includes computing device 205, examples of which can include computing environment 100. Computing device 205 can operate in a networked environment using logical connections through network 230 to one or more sources of quality measurements, such as server systems 220.

Server systems 220 can comprise computing systems, such as computing environment 100. Though each version of computing environment 100 is displayed logically as a computing system, these devices can each be a distributed computing environment encompassing multiple computing devices located at the same or at geographically disparate physical locations. Computing device 205 and server systems 220 can each act as a server or client to other server/client devices. Server systems 220A-C can each connect to storage devices 225A-C. In example 200, storage devices 225A-C make up the memory population under analysis. Though storage devices 225 are displayed logically as single units, storage devices 225 can each be a distributed computing environment encompassing multiple computing devices, can be located within their corresponding server, or can be located at the same or at geographically disparate physical locations.

Network 230 can be a local area network (LAN) or a wide area network (WAN), but can also be other wired or wireless networks. Network 230 may be the Internet or some other public or private network. Computing device 205 and server systems 220 can be connected to network 230 through network interfaces, such as by wired or wireless communication. While the network connections are shown as separate connections, these connections can be any kind of local, wide area, wired, or wireless network, including network 230 or a separate public or private network.

In operation, example 200 begins with steps 252A-C, where server systems 220 obtain quality measures for their corresponding storage devices 225A-C. In example 200, these quality measures are histograms 207A-C, which are the counts of bit errors per codeword in the storage devices 225. Through steps 254A-C and 256, these quality measures 207 are provided to computing device 205. An example of the histogram data 207A is provided in FIG. 6.

At step 258, computing device 205 converts the histograms 207 into CDF-based data 260 (1-CDF). Individual histograms 207 are averaged to obtain an overall histogram for conversion to CDF-based data 210. An example of the histogram data 210 is provided in FIG. 7. At step 260, computing system 205 formulates comparisons of the CDF-based data to metrics for quality analysis. This analysis can include computing an area formed under the CDF-based data. Optionally the area can also be based on a frequency lower bound. The size of the area can be computed such that an amount of the area below a threshold value is considered positive and any amount over the threshold is considered negative. As a further option, the analysis can further compute the ratio of the computed area to another area defined by the square that contains CDF-based data (or that contains the CDF-based data up to the frequency lower bound. Additional details regarding the quality analysis are provided in relation to FIGS. 4 and 5.

Based on the quality analysis results, computing device 205 can determine actions to take with regard to storage devices 225. In this example, the analysis results 215 indicate that the memory population is only moderately healthy, and thus should only be tasked with non-critical storage operations. At steps 262, 264A-C, and 266A-C, computing device 205 can communicate this determined action to storage devices 225A-C, causing them to be adjusted accordingly. Here, because results 215 indicate a health level of the memory population including storage devices 225 as being below a health threshold, adjustment at 266A includes setting storage devices 225A to be unavailable for critical storage functions.

Figure 3:
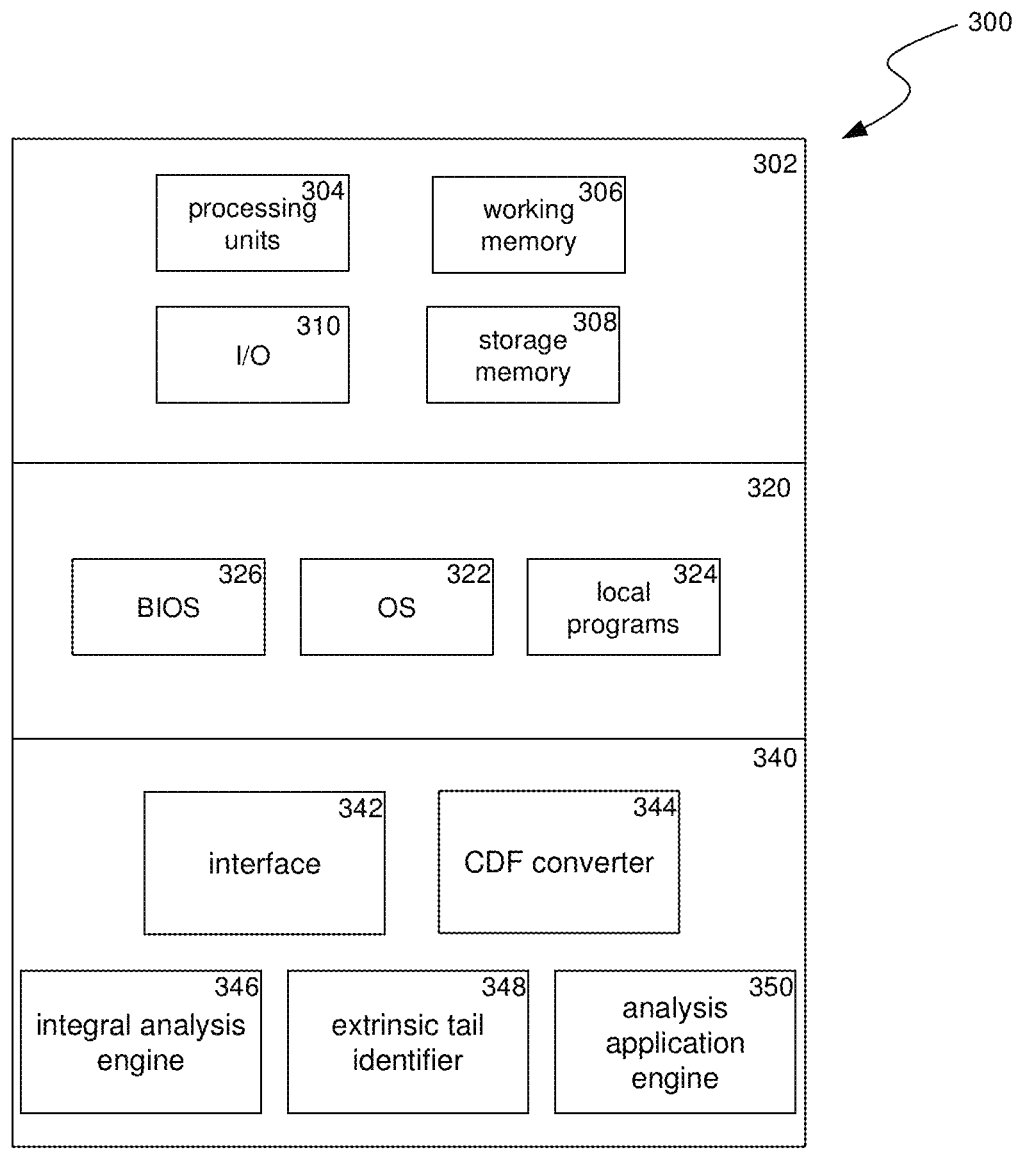
FIG. 3 is a block diagram of components which, in some implementations, can be used in a system employing the disclosed technology.

FIG. 3 is a block diagram of components 300 which, in some implementations, can be used in a system employing the disclosed technology. The components 300 include hardware 302, general software 320, and specialized components 340. As discussed above, a system implementing the disclosed technology can use various hardware including processing units 304 (e.g. CPUs, GPUs, APUs, etc.), working memory 306, storage memory 308 (local storage or as an interface to remote storage), and input and output devices 310. In various implementations, storage memory 308 can be one or more of: local devices, interfaces to remote storage devices, or combinations thereof. For example, storage memory 308 can be a set of one or more hard drives (e.g. a redundant array of independent disks (RAID)) accessible through a system bus or can be a cloud storage provider or other network storage accessible via one or more communications networks (e.g. a network accessible storage (NAS) device). Components 300 can be implemented in a client computing device such as client computing devices 205 or on a server computing device, such as server computing device 220.

General software 320 can include various applications including an operating system 322, local programs 324, and a basic input output system (BIOS) 326. Specialized components 340 can be subcomponents of a general software application 320, such as local programs 324. Specialized components 340 can include CDF converter 344, integral analysis engine 346, extrinsic tail identifier 348, analysis application engine 350, and components which can be used for providing user interfaces, transferring data, and controlling the specialized components, such as interface 342. In some implementations, components 300 can be in a computing system that is distributed across multiple computing devices or can be an interface to a server-based application executing one or more of specialized components 340.

CDF converter 344 can receive a set of quality measurements, e.g. via interface 342, and convert the quality measurements to CDF-based data. In some implementations, the quality measures can be a histogram specifying quality measures in relation to a memory population, e.g. bit errors per memory unit, read, write, or erase times, etc. In various implementations, the quality measures can be measures of other metrics such as an "x-cuttoff" or can iterate on results of a quality analysis. As an example of a x-cuttoff implementation, each histogram in a set of quality measures can have a highest value on the x-axis. Where the x-axis measures bits in error, for example, this can be the highest measured number of bits in error, referred to as the "x-cuttoff." In FIG. 6, for example, the highest bit in error count, and thus the x-cuttoff, is at 31 bits in error. Another histogram can be created using ranges of x-cuttoffs as the histogram buckets and the count of histograms with an x-cuttoff in that range as the count for that bucket.

As discussed below, quality analysis results can include values such as margins from a threshold, intersections with a threshold, areas under a CDF-based data curve, ratios of such areas as compared to the area of a rectangle containing the CDF-based data curve, and identifications of extrinsic tails. Any of these values taken for multiple different memory populations can be measured in terms of a histogram and used by the process described herein in a second level quality analysis among memory populations.

CDF-based data is data that incorporates the CDF function of a set of data, where the CDF is the function whose value is the probability that a corresponding continuous random variable has a value less than or equal to a given value. For example, in terms of error measures of codewords in memory, the CDF-based data can specify, for a given amount of errors, the frequency of codewords that are expected have no more than that amount of errors. In some implementations, the CDF-based data can be 1-CDF, where the CDF is taken relative to the received histogram of quality measures.

Integral analysis engine 346 can compute an integral of the CDF-based data generated by the CDF converter 344. This integral can be used as a health measure of the memory population the CDF-based data is derived from. This integral can be the area between a curve formed by the CDF-based data (i.e. the CDF curve) and a frequency baseline, e.g. zero or $10^\wedge 0$ (i.e. one), this area is referred to as being "under" the curve.

In some implementations, a frequency lower bound can be set for the integral specifying that the integral analysis engine 346 should take the area under the CDF curve up to the point the CDF curve crosses the frequency lower bound, at which point the integral analysis engine 346 should take the area under the frequency lower bound, i.e. the area between the frequency lower bound and the frequency baseline. An area computed using a frequency lower bound is referred to herein as a "bounded area." The area should end at the point on the x-axis corresponding to the last point in the CDF-based data, whether or not the integral analysis engine 346 is taking the area from under the CDF curve or a frequency lower bound.

In some implementations, a threshold can be set, such as system trigger threshold or UECC threshold. Where such a threshold is set, integral analysis engine 346 can compute the area such that the size of the area past the threshold can be subtracted from the size of the area before the threshold.

In some implementations, integral analysis engine 346, instead of using the integral directly as the health measure, the health measure can be computed as a ratio. Integral analysis engine 346 can compute this as the ratio of A) the size of the area under the curve to B) the size of a second area bounded by a rectangle. Integral analysis engine 346 can determine this second area as the area formed by the smallest rectangle, with edges parallel to the x or y axis, that can hold the CDF curve. This rectangle can be the rectangle formed with the upper left corner being the first data point of the CDF-based data and the lower right corner being the last data point of the CDF-based data. In implementations where the area is bounded, instead of setting the bottom edge of the rectangle to correspond to the CDF data point with the lowest frequency, the bottom edge of the rectangle can correspond to the frequency lower bound. In some implementations, instead of setting the top edge according to the first CDF data point, the top edge can be set at the baseline frequency.

Extrinsic tail identifier 348 can determine if a projection of the CDF-based data sufficiently matches the actual CDF-based data. If not, extrinsic tail identifier 348 can identify the difference as an "extrinsic tail." An extrinsic tail identification can indicate that the memory population the CDF-based data is derived for has an issue, such as a defect, an improper operational parameter, etc. In some implementations, the projection of the CDF-based data can be a best fit of the CDF-based data to a linear function. In some implementations, other modeling techniques can be used to determine the projection, such as using a function of a different degree, using the average of CDF-based data from other memory populations, or applying a machine learning algorithm to the CDF-based data or data of other memory populations to predict next data points from previous data points of the CDF-based data. In some implementations, the projection can be based on a portion of the CDF-based data. For example, the extrinsic tail identifier 348 can fit a linear function to a portion of the CDF-based data that best fits a line, excluding an initial part of the CDF-based data that does not provide a good fit.

Extrinsic tail identifier 348 can determine whether there is a sufficient match between the projection of the CDF-based data and the actual CDF-based data by determining if the difference between the two at any point is above a threshold. In some implementations, this determination can be based on a comparison of an average difference of all points within a window. For example, extrinsic tail identifier 348 can determine the difference between the projection of the CDF-based data and the actual CDF-based data for each point on the x-axis that are within 5 error units of each other, and determine if the average of these differences is above a threshold. In some implementations, extrinsic tail identifier 348 may only use points above a particular value, e.g. by excluding points that were excluded for the fitting the projection to the CDF-based data.

Analysis application engine 350 can determine whether an action has been mapped to the results of the analysis, and if so, cause the action to be taken. Examples of actions that can be mapped to various analysis results include: modifying operating parameters of a memory population to increase speed or reliability, specifying types of storage operations that a memory population is allowed to perform, or disabling or removing a memory population from a memory system. For example, depending on a health measure computed by integral analysis engine 346 or depending on an identification of an extrinsic tail identified by extrinsic tail identifier 348, analysis application engine 350 can make a corresponding adjustment to an operating parameter of the memory population. As a more specific example, a clock used for operations on the memory population can be decreased based on a normalization of the health measure. As another example, if an extrinsic tail is identified, the memory population can be deactivated or marked for further analysis.

Those skilled in the art will appreciate that the components illustrated in FIGS. 1-3 described above, and in each of the flow diagrams discussed below, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Figure 4:
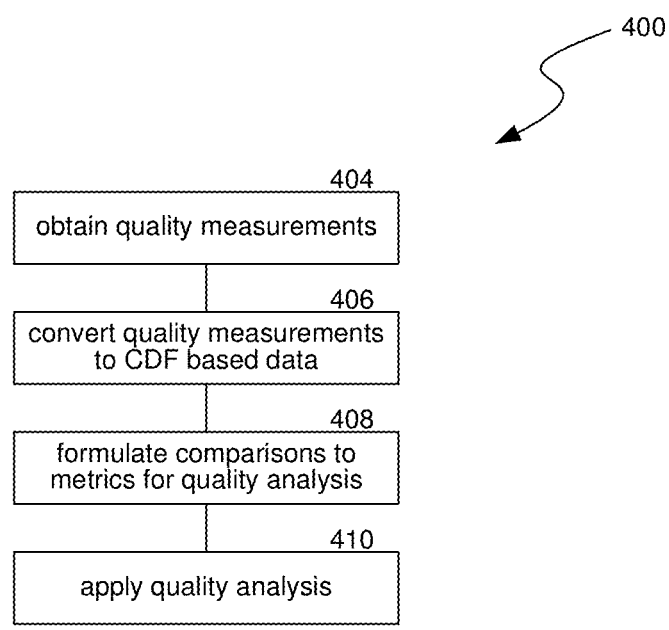
FIG. 4 is a flow diagram of a process used in some implementations for applying a quality analysis to CDF-based data, to improve memory systems.

FIG. 4 is a flow diagram of a process 400 used in some implementations for applying a quality analysis to CDF-based data, to improve memory systems. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the memory quality engine 164 of FIG. 1. Although shown in a particular sequence or order, unless otherwise specified, the order of the processes can be modified. Thus, the illustrated implementations should be understood only as examples, and the illustrated processes can be performed in a different order, and some processes can be performed in parallel.

Additionally, one or more processes can be omitted in various embodiments. Thus, not all processes are required in every implementation. Other process flows are possible. At block 404, process 400 can obtain quality measurements for a memory population under examination. In some implementations, process 400 can obtain the quality measurements in terms of frequency of memory units for a given error count. For example, the memory unit can be logical structures of the memory population, a portion of memory hardware, or multiple memory devices. More specific examples of memory units include blocks, pages, lines, codewords, regions, sectors, die, cells, drives, server racks, clusters, etc. The quality measures can be of various types such as bit error counts, faults, read operation execution times, write operation execution times, erase operation execution times, etc. In some implementations, the quality measures can be in the form of histogram data. The histogram can represent the count, for a given amount of errors, of the memory units that had that amount of errors. In some implementations, the quality measures can be quality measures for multiple items under analysis. For example, each drive in a memory population can provide a separate set of quality measures. As discussed above, while the figures are discussed in terms of quality measures for memory populations, the systems and methods described herein can also apply to other technologies. For example, the quality measures can be in relation to CPUs, networks, displays, power units, etc. In some implementations, the quality measures can be for non-computing measures such as engine performance, delivery times, material durability, etc. An example graph illustrating sample quality measures is provided in relation to FIG. 6.

At block 406, process 400 can convert the obtained quality measurements into CDF-based data. In some implementations, the CDF-based data is the CDF of the received quality measures. In some implementations, process 400 can generate the CDF-based data by taking the CDF of the received quality measures, then using 1-CDF as the CDF-based data. In cases where the received quality measures are multiple sets for various memory units, process 400 can either first average the histograms before generating the CDF-based data or process 400 can create CDF-based data for each set, and combine (e.g. sum) the results. In some implementations, the CDF-based data can be on a logarithmic scale. An example graph illustrating sample CDF-based data is provided in relation to FIG. 7.

At block 408, process 400 can formulate a comparison of the CDF-based data to metrics for a quality analysis of the memory population. In some implementations, formulating this comparison can include computing an area between the baseline frequency and CDF-based data. In some cases the area is between the baseline frequency and a combination of the CDF-based data and a lower frequency bound. In some implementations, the comparison further includes determining a ratio of this area to the area of a rectangle encompassing the CDF-based data. Additional details regarding formulation the comparison to CDF-based data are provided below in relation to FIG. 5. Example graphs illustrating results of block 408 are provided in relation to FIGS. 9A and 9B.

At block 410, process 400 can apply results of a quality analysis to make improvements in a memory system by causing actions in relation to the memory population. In various implementations, whether or what action to cause can be selected: by determining a comparison metric for the memory population by applying one or more thresholds to the results of the quality analysis, by categorizing the memory population based on the results of the quality analysis, or by comparing portions of the quality analysis to expected or projected results. More specifically, in some implementations, a comparison metric can use a pass/fail threshold established for analyzing a memory population which can be compared to analysis results (e.g. a margin or health value). In some implementations, the comparison metric can map scores from the quality analysis into categories. For example, the possible health scores can be divided into three ranges, amounting to "good," "acceptable" and "bad" classifications. The delimiting values for these ranges can be set based on a historical analysis of memory populations with various health scores, and how efficiently or reliably devices with various scores performed memory operations.

In some implementations, the comparison metrics can compare the quality analysis results from multiple executions of process 400 to categorize differences between memory populations. For example, the analysis results from a memory population that originated from a first factory can be compared to results from a memory population that originated from a second factory, where the difference can be used to score the factory. As another example, because the analysis results can be compared across device types, a memory population that is made up of a first type of memory devices can be compared to results from a memory population that is made up of a different type of memory devices.

In some implementations, the comparison metrics can use the analysis results as input to a function configured to determine an adjustment amount for a memory system. For example, a margin analysis result can be used as a parameter to a function that specifies how much to adjust memory voltage tolerance. As yet a further example, the comparison metrics can include a determination of whether the CDF-based data indicates an extrinsic tail, i.e. higher error rates in the CDF-based data that doesn't fit well to a projection of the CDF-based data from the lower error rates. Alternatively, the quality analysis results can compare the CDF-based data to CDF-based data for other, similar memory populations. If there is an extrinsic tail or if there is beyond a threshold amount of difference from other CDF-based data, the memory population can be classified as exceptional, which may indicate a problem with the memory population.

Any of the comparison metrics (e.g. marking the memory population as pass/fail, assigning a classification to the memory population, using a function to transform the analysis results into a corresponding output, comparing among memory populations, or identifying a memory population as exceptional) can be mapped to an action trigger. Process 400 can use this mapping of comparison metric results to action triggers to cause a corresponding action to occur. For example, in implementations where the memory population has a comparison metric result marking the memory population as failed, as exceptional, or with a score failing in a disfavored range, the action trigger can cause the memory population to be disabled, removed from a memory system, have operating parameters reduced to increase reliability, or marked for further analysis. In some implementations, for comparison metrics marking memory populations as passed or that have a score falling in other particular ranges, the action triggers can be an action or lack of removal that permits the memory population to continue in operation, to mark the memory population for particular corresponding types of storage jobs, to mark the memory population for further analysis, to have the memory population's operating parameters changed an amount based on the assigned category, or to schedule the memory population for a follow-up analysis to check for future deterioration. In implementations where there is a comparison between memory populations, the comparison results can be used to identify problematic component sources, manufacturing facilities, production processes, memory part designs, or other factors about the construction or composition of the memory population.

In some implementations, instead of, or in addition to, automatically performing actions, the comparisons from block 408 can be incorporated in a user interface on a display.

Figure 5:
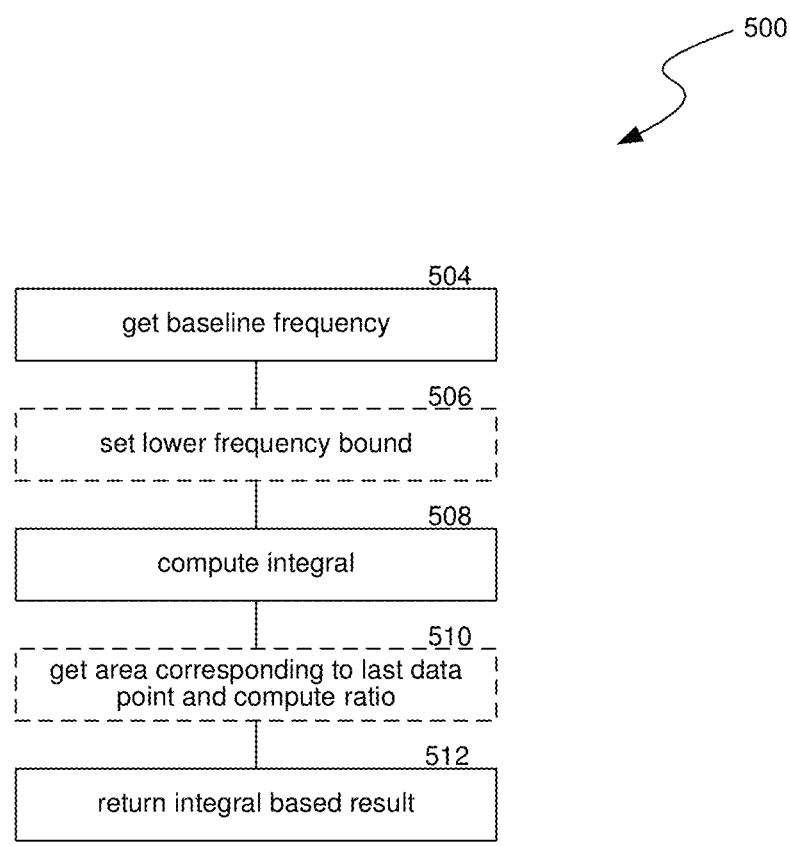
FIG. 5 is a flow diagram of a process used in some implementations for formulating an integral analysis of CDF-based data.

FIG. 5 is a flow diagram of a process 500 used in some implementations for formulating an integral analysis of CDF-based data. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the memory quality engine 164 of FIG. 1. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible. At block 504, process 500 obtains or sets a baseline frequency. The Baseline frequency can be a set value along a y-axis, e.g. at 0 or 1 or can be set according to an initial point of the CDF-based data, e.g. a horizontal line corresponding to the highest frequency CDF data point.

Figure 9A:
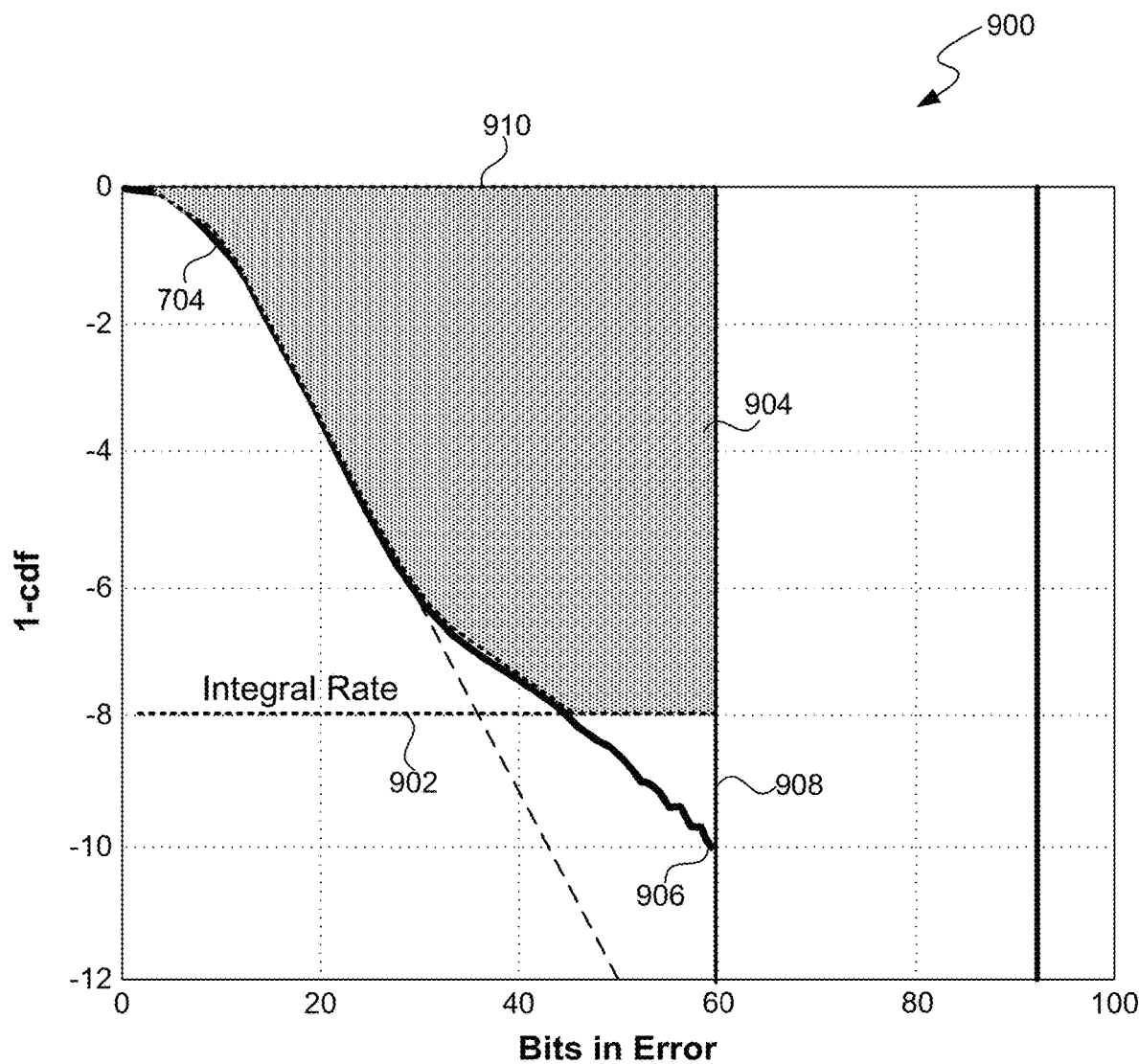
FIG. 9A is a conceptual diagram of example analysis results for the CDF-based data of FIG. 8, using a bounded, non-ratio method.

At block 506, process 500 can set a lower frequency bound. As indicated by the dashed lines for block 506, setting a lower frequency bound is optional for implementations where a bounded area is computed. A lower frequency bound can specify a point on the y-axis where it has been determined that the frequency of lower-frequency results is so low they should be excluded from the integral analysis. Thus, as further discussed below at block 508, the lower frequency bound is used instead of taking the full area between the baseline frequency and the CDF curve. In FIG. 9A, for example, the lower frequency bound 902 is set.

At block 508, process 500 can compute an integral as the bounded or unbounded area between the baseline frequency and the curve formed by the CDF-based data from block 406. Where a lower frequency bound has been set and the CDF curve crosses that bound, the area can first be taken between the CDF curve and the baseline frequency from the beginning of the CDF curve until the CDF curve crosses the lower frequency bound. From this point, the area can next be taken between the lower frequency bound and the baseline frequency until the point on the x-axis where the CDF-based data ends. Put another way, the area can be computed between A) the baseline frequency and B) a combination of the CDF curve and the lower frequency bound, where the combination is obtained by, for any given point along the CDF-based data, taking the value from either 1) the CDF curve or 2) the lower frequency bound, whichever is closer to the baseline frequency. In some implementations where a threshold is set, such as a system trigger threshold or UECC threshold, process 500 can count the part of the determined area before the threshold on the x-axis as positive the part of the determined area after the threshold on the x-axis as negative, where the total area is the sum of these positive and negative pieces.

At block 510, process 500 can determine an area of a rectangle that contains the CDF curve where each edge of the rectangle is parallel to either the x-axis or y-axis. As indicated by block 510 being shown in dashed lines, block 510 only occurs where the implementation is using a ratio of the area from block 508 with the area of the rectangle. In some implementations, this rectangle is the smallest rectangle that contains the CDF curve. In some implementations where the area from block 508 is bounded, this rectangle is set with one corner starting at the first point of the CDF-based data and the opposite corner set on the x-axis at the end of the CDF-based data but on the y-axis at the lower frequency bound of block 506. In some implementations, similarly to the area in block 508, an amount of the rectangle area past a set threshold can count as a negative area. Process 500 can then compute the ratio of the area from block 508 and the area of the rectangle.

At block 512, process 500 can return either a health measure of the memory population, either as the area computed at block 508 or the ratio computed at block 510.

Figure 6:
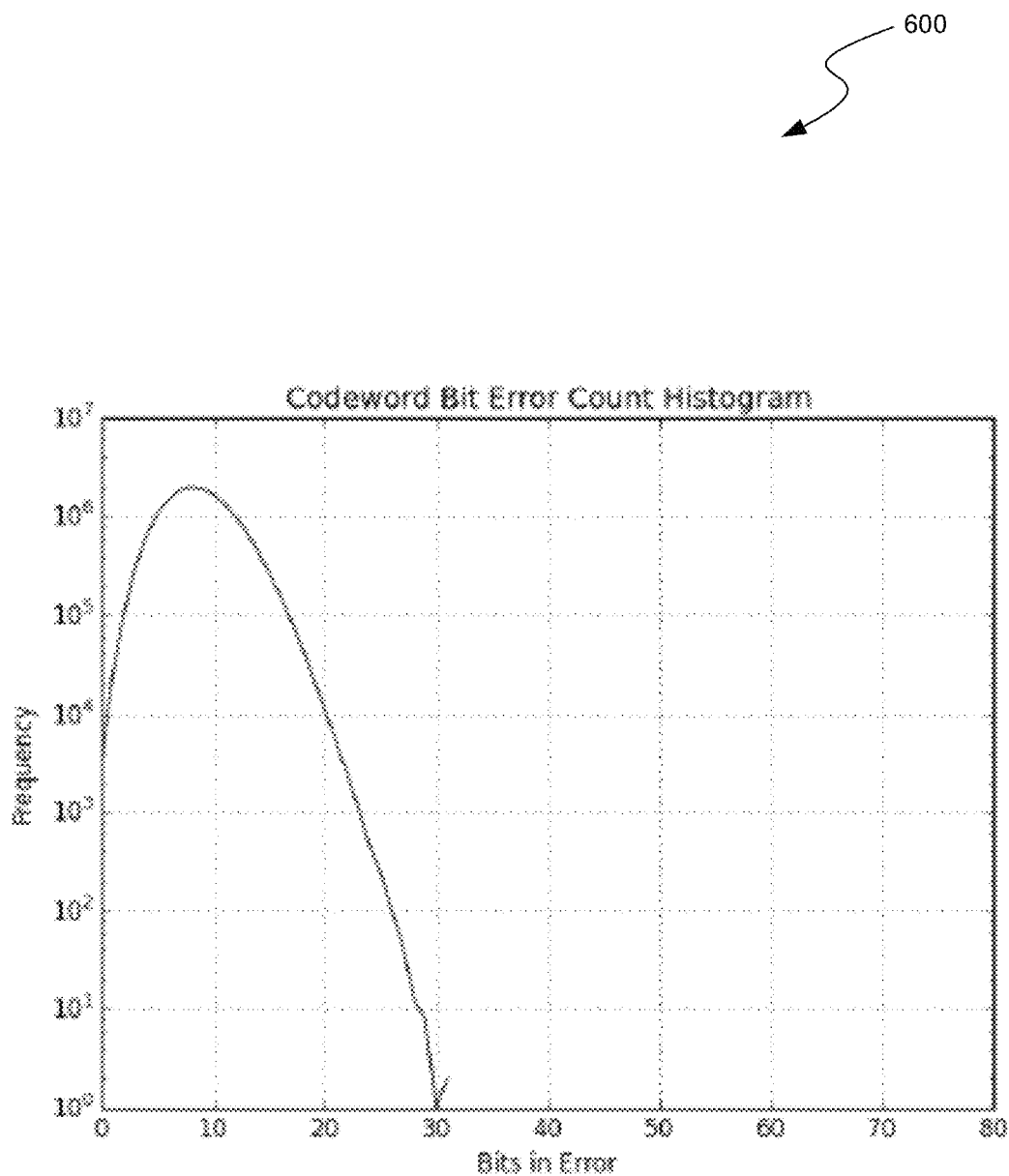
FIG. 6 is a conceptual diagram of an example graph of quality measurements, expressed as a codeword/bit error count histogram.

FIG. 6 is a conceptual diagram of an example 600 graph of quality measurements, expressed as a codeword/bit error count histogram. In example 600, the quality measurements are expressed as a histogram showing a number of bit errors on the x-axis and an amount of codewords determined to have that number of bit errors on the y-axis.

Figure 7:
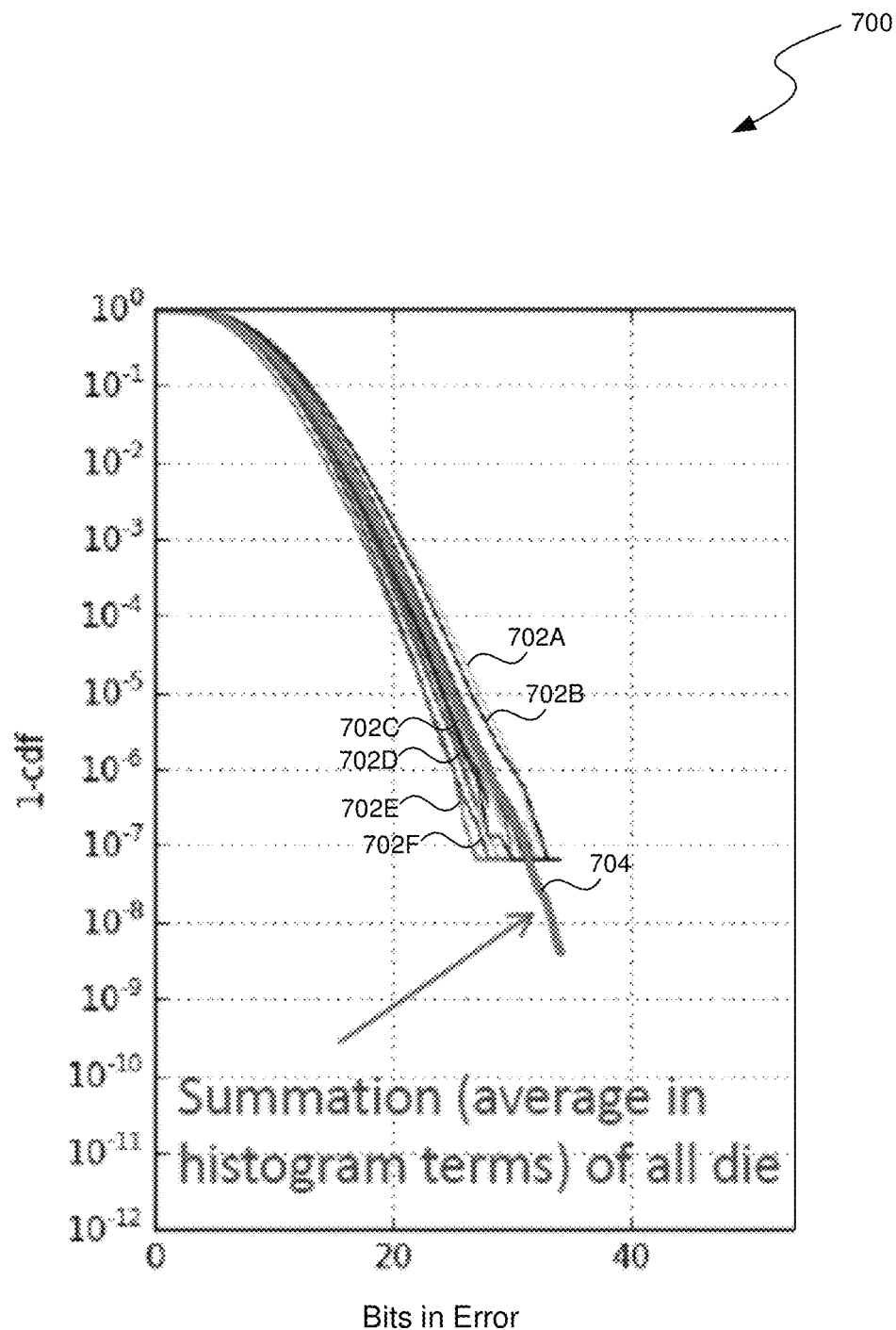
FIG. 7 is a conceptual diagram of an example of CDF-based data generated from the quality measurements of FIG. 6.

FIG. 7 is a conceptual diagram of an example 700 of CDF-based data generated from the quality measurements of FIG. 6. In example 700, the CDF-based data is 1-CDF the quality measurements, on a logarithmic scale. The quality measurements of FIG. 6 have been converted into a first CDF-based data 702A and multiple other histograms from additional portions of the memory population have been converted into additional CDF-based data 702B-F. CDF-based data 702A-F have been combined as a summation into overall CDF-based data 704.

Figure 8:
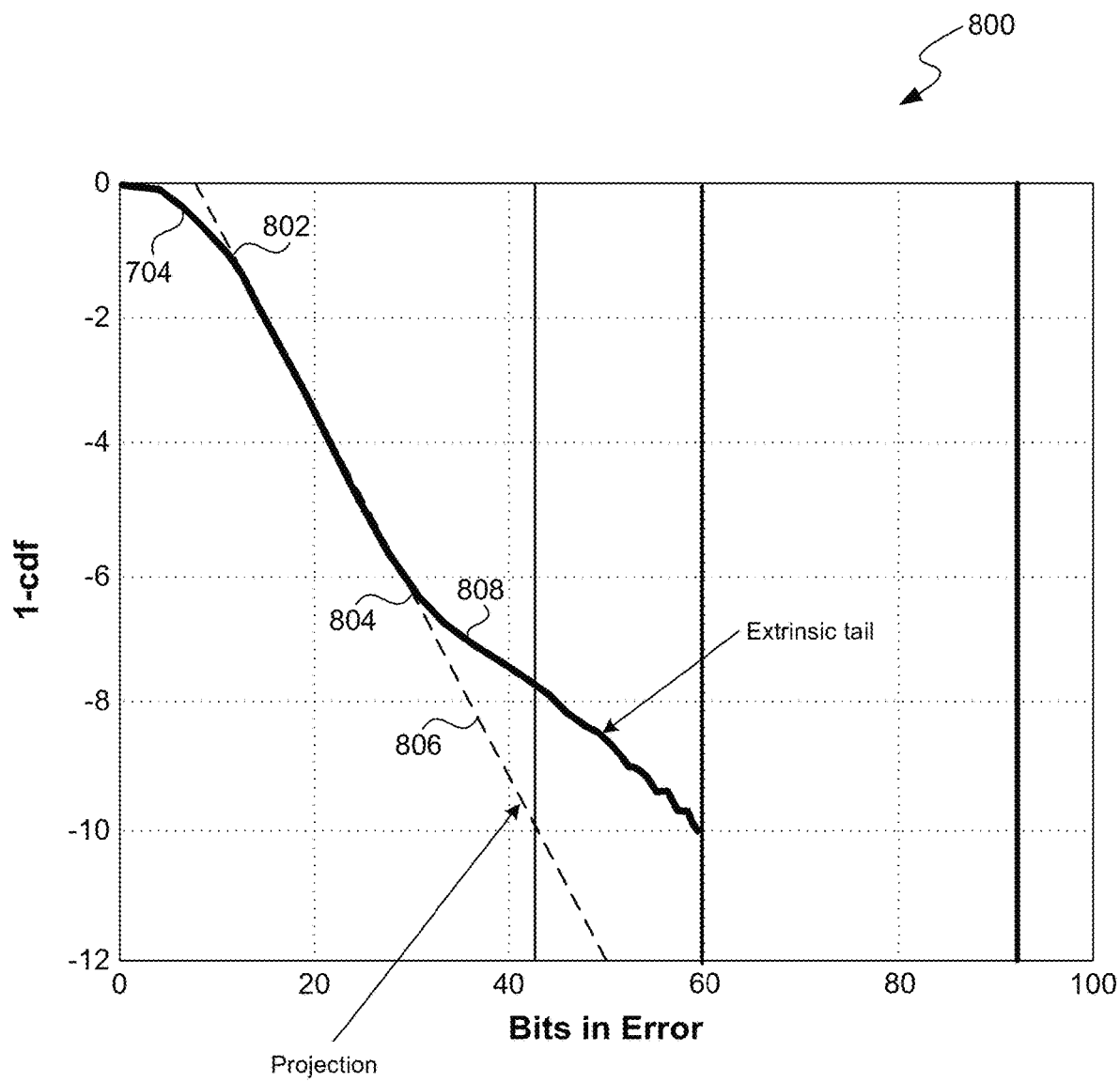
FIG. 8 is a conceptual diagram of example of CDF-based data indicating a memory population as an extrinsic outlier.

FIG. 8 is a conceptual diagram of example 800 of CDF-based data indicating a memory population as an extrinsic outlier. An extrinsic outlier occurs where a threshold amount of the CDF-based data 704, e.g. from 802 to 804, fits well with a projection 806, but then a subsequent portion of the CDF-based data 704, e.g. at 808, is a threshold amount distant from the projection, and thus has an extrinsic tail. When the CDF-based data for a memory population indicates an extrinsic outlier, it can indicate that there is a problem with the memory population. For example, where the memory population is a drive, an extrinsic outlier can indicate that there is a flaw in the drive.

FIG. 9A is a conceptual diagram of example 900 analysis results for the CDF-based data of FIG. 8, using a bounded, non-ratio method. In example 900, integral rate lower frequency bound 902 is set at 10^−8. The lower frequency bound 902 is set so extremely unlikely circumstances (e.g. those less likely than 1 in 10^8) are not reflected in the analysis results. The integral (area 904) is then taken that is between baseline frequency 910 and both the CDF-based data 704 and the lower frequency bound 902. On the x-axis, this area is taken from the beginning of the CDF-based data (at 0) to the end of the CDF-based data (the x-axis value corresponding to 906, the last point of the CDF-based data). In some implementations, where any portion of area 904 was beyond system trigger condition 908, the amount of the area past system trigger condition 908 is considered negative area. The volume of area 904 can be a measure of the health of the memory population. In some implementations, no bound 902 is set.

Figure 9B:
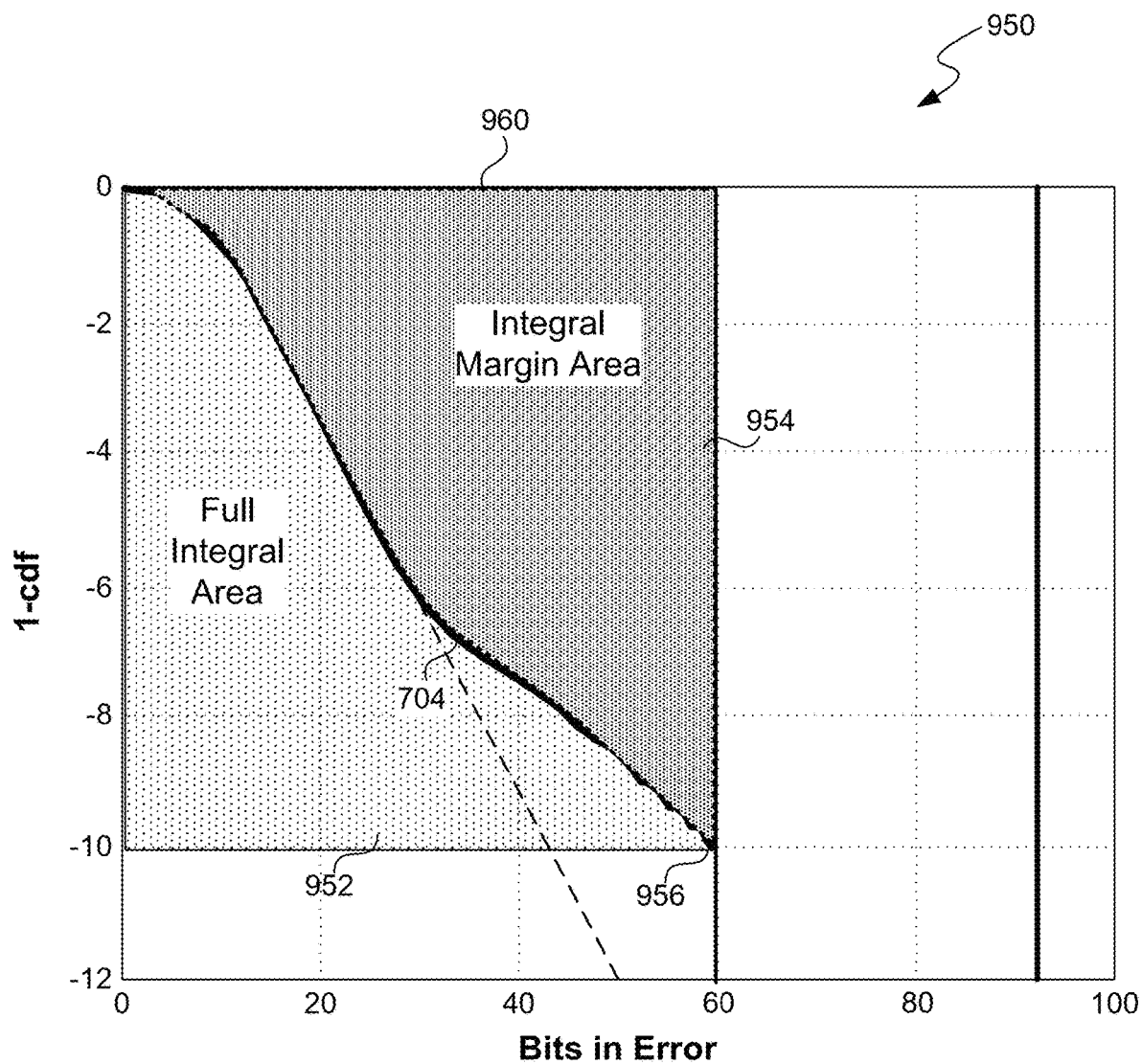
FIG. 9B is a conceptual diagram of example analysis results for the CDF-based data of FIG. 8, using an unbounded, ratio method.

FIG. 9B is a conceptual diagram of example 950 analysis results for the CDF-based data of FIG. 8, using an unbounded, ratio method. A first integral (area 954) is taken that is between the CDF-based data 704 and the baseline frequency 960. On the x-axis, this area is taken from the beginning of the CDF-based data (at 0) to the end of the CDF-based data (the x-axis value corresponding to 956, the last point of the CDF-based data). A second integral (area 952) is taken that is the area of the box on the x-axis from 0 to the x-axis value corresponding to 956 and on the y-axis from 10^0 to the y-axis value corresponding to 956. The ratio of area 954 to area 952 can be a measure of the health of the memory population. In some implementations, a lower frequency bound, similar to lower frequency bound 902, can be set. This bound can set the upper limit for both area 954 and area 952.

The calculated analysis results (i.e. health measures), whether as a ratio or integral and whether bounded or unbounded, can then be compared to metrics, and memory system operating parameters can be adjusted accordingly. For a given analysis result, a function or mapping can specify how operating parameters should be adjusted. For example, clock rate, voltage, etc. can be adjusted to increase speed or increase reliability. In some implementations, this process of computing a health measure and making operating parameter adjustments can be repeated until the computed health measure reaches an acceptable value.

Figure 10:
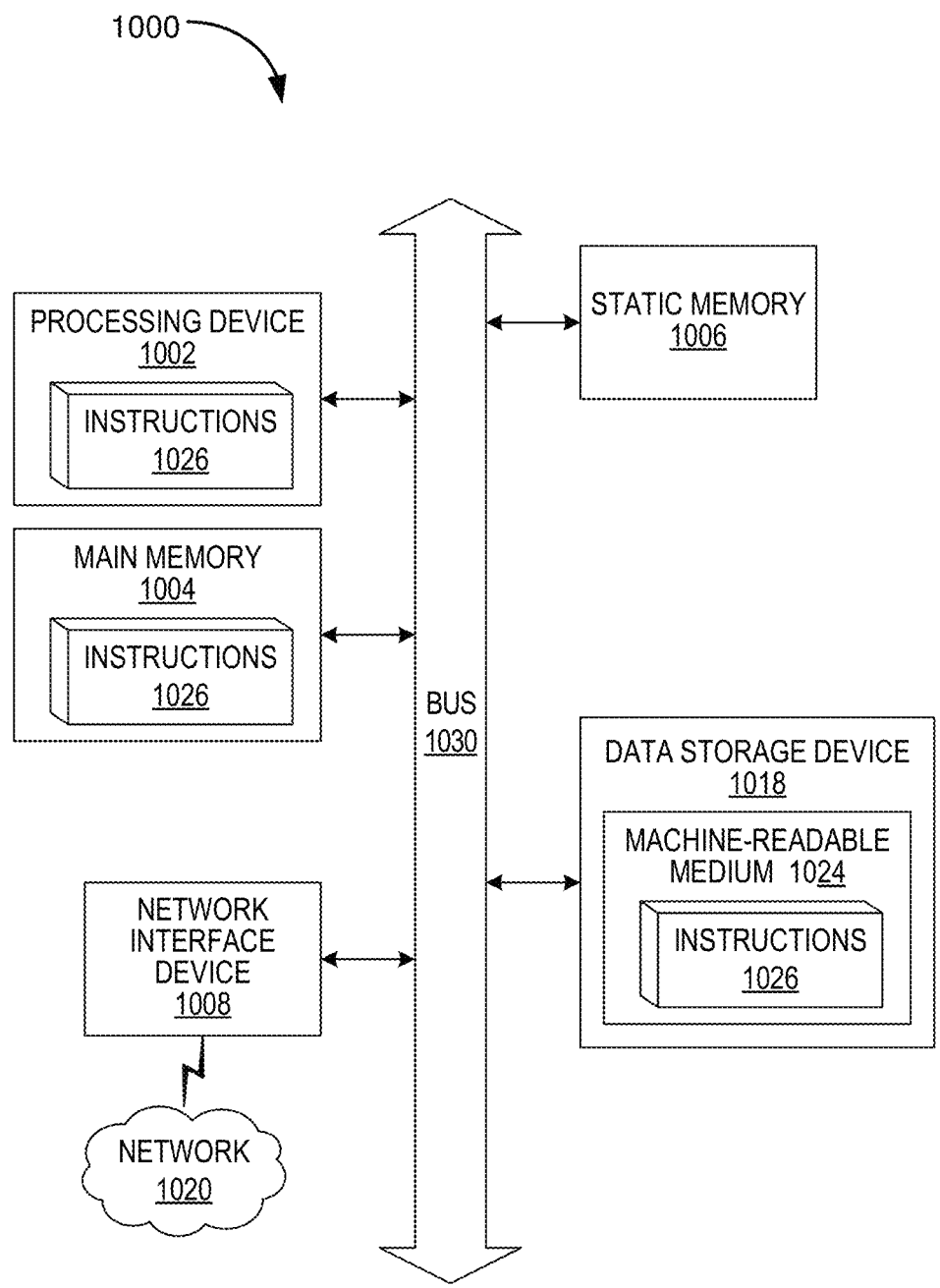
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some implementations, the computer system 1000 can correspond to computing system 100 that includes or utilizes a memory quality engine 164. In alternative implementations, the machine can be connected (e.g., networked) to other machines in a LAN, an intranet, an extranet, and/or the Internet, e.g. via network 1020. The machine can operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions or software 1026 embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory 150.

In one implementation, the instructions 1026 include instructions to implement functionality corresponding to the memory quality engine 164. While the machine-readable storage medium 1024 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

We claim:

1. A method comprising:
   obtaining quality measures, based on counts of errors, for a memory population of a memory system;
   converting the quality measures into cumulative distribution function (CDF)-based data, wherein the CDF-based data defines a CDF curve in relation to at least two axes;
   performing a quality analysis based on the CDF-based data by computing a first area, wherein at least a portion of the first area is computed based on the CDF curve and one or more bounds defined on one or more of the at least two axes; and
   causing, based on the computed first area, one or more actions in relation to the memory population.

2. The method of claim 1, further comprising:
   identifying a baseline frequency as a first demarcation on at least one of the at least two axes;
   identifying a lower frequency bound as a second demarcation on at least one of the at least two axes; and
   wherein the portion of the first area is a first portion of the first area with bounds on the x-axis that:
   begin at the smallest point on the x-axis that corresponds to a point in the CDF-based data; and
   end at the point on the x-axis that corresponds to a point where the CDF curve intersects with the lower frequency bound,
   wherein a second portion of the first area is computed as an area between the baseline frequency and the lower frequency bound with bounds on the x-axis that:
   begin at the point on the x-axis that corresponds to the point where the CDF curve intersects with the lower frequency bound; and
   end at the largest point on the x-axis that corresponds to a point in the CDF-based data; and
   wherein the first area comprises the combination of the first portion and the second portion.

3. The method of claim 1, further comprising:
   computing a second area that comprises at least the area of a rectangle, the rectangle being based on at least a portion of the CDF-based data; and
   computing a ratio between the first area and the second area.

4. The method of claim 1, further comprising:
   identifying a baseline frequency as a first demarcation on at least one of the at least two axes;
   identifying a lower frequency bound as a second demarcation on the at least one of the at least two axes;
   computing a second area that comprises at least the area of a rectangle that is based on the CDF-based data and the lower frequency bound; and
   computing a ratio between the first area and second area,
   wherein computing the first area is performed by combining A) the area between the baseline frequency and the portion of the CDF curve that is based on the CDF-based data, and B) an area that 1) corresponds, on the x-axis, to a second portion of the CDF curve and 2) is between the lower frequency bound and the baseline frequency.

5. The method of claim 1, wherein computing the first area further comprises:
   determining a first section of the first area that, on the x-axis, is before a threshold condition;
   determining a second section of the first area that, on the x-axis, is after the threshold condition; and
   computing the first area as the first section minus the second section.

6. The method of claim 5, wherein the threshold condition is an uncorrectable error correction condition (UECC) threshold specifying the error rate above which errors are not recoverable by a controller of the memory population.

7. The method of claim 1, wherein the one or more actions comprise a modification to operating parameters for the memory population, and wherein the modification comprises adjusting a voltage, a clock rate, or a latency, or a combination thereof for the memory population.

8. An apparatus comprising:
   a memory;
   one or more processors;
   an interface configured to, using the one or more processors:
   obtain quality measures for a memory population of a memory system, wherein the quality measures comprise a histogram indicating counts of errors per memory unit in the memory population;
   a cumulative distribution function (CDF) converter configured to, using the one or more processors, convert the quality measures into CDF-based data;
   an integral analysis engine configured to, using the one or more processors, perform a quality analysis based on the CDF-based data by:
   determining two areas, wherein each of the two areas is based on aspects of a CDF curve formed by the CDF-based data, and
   computing a ratio of the two areas; and
   an analysis application engine configured to, using the one or more processors, cause, based on the computed ratio, a modification to operating parameters for the memory population.

9. The apparatus of claim 8, wherein the CDF-based data is defined in terms of at least two axes and wherein determining the two areas -comprises:
identifying a baseline frequency as a first demarcation on at least one of the at least two axes;
identifying a lower frequency bound as a second demarcation on the at least one of the at least two axes;
computing a first area between A) the baseline frequency and B) a combination of the CDF curve- and the lower frequency bound, wherein the combination is obtained by, for any given x-axis point in the CDF-based data, taking the y-axis value of either the CDF curve or the lower frequency bound, whichever is closer to the baseline frequency;
computing a second area that comprises at least the area of a rectangle that is based on the CDF-based data and the lower frequency bound; and
computing, as the ratio of two areas—, a ratio between the first area and the second area.

10. The apparatus of claim 9, wherein computing the first area further comprises:
determining a first portion of the first area that, on the x-axis, is before a threshold condition;
determining a second portion of the first area that, on the x-axis, is after the threshold condition; and
computing the first area as the first portion minus the second portion.

11. The apparatus of claim 10, wherein the threshold condition is a system trigger threshold that specifies the error count correlated to data recovery speed as an error rate above which the memory system has to invoke secondary methods to perform data recovery by a controller of the memory system.

12. The apparatus of claim 9,
wherein each side of the rectangle is parallel to either the x-axis or y-axis; and
wherein the rectangle is formed with a first corner being either the first point of the CDF-based data or the origin of the CDF-based data and a second corner, opposite the first corner, having a y-axis value that matches the lower frequency bound and an x-axis value that matches the x-axis value of the last point of the CDF-based data.

13. The apparatus of claim 9, wherein the identified baseline frequency is the x-axis of the CDF-based data.

14. The apparatus of claim 9, wherein the memory population comprises: a plurality of memory cells, a plurality of memory pages, a plurality of memory word lines, a plurality of memory blocks, a plurality of memory planes, a plurality of memory dies, or a plurality of memory devices, or a combination thereof.

15. The apparatus of claim 9, wherein the modification to the operating parameters comprises adjusting a voltage, a clock rate, or a latency, or a combination thereof for the memory population based on the computed ratio.

16. A non-transitory computer-readable storage medium storing instructions that, when executed by a computing system, cause the computing system to perform operations comprising:

obtaining quality measures for a memory population of a memory system, wherein the quality measures comprise a histogram indicating counts of errors per memory unit in the memory population;
converting the quality measures into cumulative distribution function (CDF)-based data by computing a cumulative distribution function of the histogram;
performing a quality analysis based on the CDF-based data, the quality analysis comprising:
determining two areas, wherein each of the two areas is based on aspects of a CDF curve formed by the CDF-based data; and
computing a ratio of the two areas; and
causing, based on the computed ratio, a modification to operating parameters for the memory population.

17. The non-transitory computer-readable storage medium of claim 16, wherein the CDF-based data is defined in terms of at least two axes and wherein determining the two areas —comprises:
identifying a baseline frequency as a first demarcation on at least one of the at least two axes;
identifying a lower frequency bound as a second demarcation on the at least one of the at least two axes;
computing a first area between A) the baseline frequency and B) a combination of the CDF curve- and the lower frequency bound, wherein the combination is obtained by, for any given x-axis point in the CDF-based data, taking the y-axis value of either the CDF curve or the lower frequency bound, whichever is closer to the baseline frequency;
computing a second area that comprises at least the area of a rectangle that is based on the CDF-based data and the lower frequency bound; and
computing, as the ratio of two areas—, a ratio between the first area and the second area.

18. The non-transitory computer-readable storage medium of claim 17, wherein computing the first area further comprises:
determining a first portion of the first area that, on the x-axis, is before a threshold condition;
determining a second portion of the first area that, on the x-axis, is after the threshold condition; and
computing the first area as the first portion minus the second portion.

19. The non-transitory computer-readable storage medium of claim 18, wherein the threshold condition is a system trigger threshold that specifies the error count correlated to data recovery speed as an error rate above which the memory system has to invoke secondary methods to perform data recovery by a controller of the memory system.

20. The non-transitory computer-readable storage medium of claim 16, wherein the modification to the operating parameters comprises adjusting a voltage, a clock rate, or a latency, or a combination thereof for the memory population based on the computed ratio.

* * * * *